United States Patent
Hsueh et al.

(10) Patent No.: US 9,246,099 B1
(45) Date of Patent: Jan. 26, 2016

(54) LOW-TEMPERATURE DEPOSITION OF NITRIDES BY UV-ASSISTED ALD OR CVD

(71) Applicant: Intermolecular Inc., San Jose, CA (US)

(72) Inventors: Chien-Lan Hsueh, Campbell, CA (US); Randall J. Higuchi, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/539,105

(22) Filed: Nov. 12, 2014

(51) Int. Cl.
*H01L 21/469* (2006.01)
*H01L 45/00* (2006.01)
*C23C 16/455* (2006.01)

(52) U.S. Cl.
CPC ...... *H01L 45/1616* (2013.01); *C23C 16/45527* (2013.01); *C23C 16/45536* (2013.01); *C23C 16/45544* (2013.01); *H01L 45/145* (2013.01)

(58) Field of Classification Search
CPC .............. H01L 21/0228; H01L 21/02271; H01L 21/02274; H01L 21/02164; H01L 21/0217; H01L 21/02532; H01L 45/08; H01L 45/146; H01L 21/0262; H01L 29/517; H01L 45/1616; H01L 21/02175; H01L 21/02216

USPC .......... 118/697, 719; 427/569; 257/E31.008, 257/E21.09
See application file for complete search history.

(56) References Cited

U.S. PATENT DOCUMENTS 4,588,610 A  5/1986  Yamazaki
5,094,966 A  3/1992  Yamazaki

OTHER PUBLICATIONS

Dail Eom et al.; Properties of Aluminum Nitride Thin Films Deposited by an Alternate Injection of Trimethylaluminum and Ammonia under Ultraviolet Radiation; Feb. 22, 2006; Journal of the Electrochemical Society; Unknown.

*Primary Examiner* — Mark A Laurenzi

(57) ABSTRACT

Compound layers, such as metal silicon nitrides, are formed by ALD or CVD from precursors with incompatible reaction temperature ranges. The substrate is held at a temperature within the lower reaction temperature range (e.g., that of a metal precursor). The low-temperature precursor and its reactant react to form an ALD monolayer or thin CVD layer. The high-temperature precursor and its reactant are pulsed in the chamber, and the substrate is irradiated with ultraviolet light. The ultraviolet light adds energy to the system to overcome the reaction barrier despite the substrate temperature being below the minimum reaction temperature of the high-temperature precursor.

13 Claims, 4 Drawing Sheets

LOW-TEMPERATURE DEPOSITION OF NITRIDES BY UV-ASSISTED ALD OR CVD

BACKGROUND

Related fields include Related fields include thin-film formation by atomic layer deposition (ALD), chemical vapor deposition (CVD), and related techniques; in particular, formation of compound nitrides of components with differing reaction temperatures.

Advanced thin-film devices can only benefit from new materials if those materials can be reliably produced. Oxides, nitrides and oxynitrides of mixed materials show promise, for example, as variable-resistance and constant-resistance layers of resistive-switching memory (sometimes called "ReRAM"), and in other applications. In some of the applications, stoichiometric oxygen and/or nitrogen content is desirable; in others, non-stoichiometric variations are preferred. However, some of these complex compounds can be difficult to deposit or grow in the desired ratios of the different elements.

Various nitrides have been considered for various components of ReRAM cells, in particular for embedded resistors because of their stable performance and tunable resistance characteristics. However, deposition of nitrides usually requires elevated temperatures that may be damaging to other cell or circuit components. Furthermore, the high temperature requirement limits the selection of the precursors that may be reacted with nitrogen containing precursors during deposition of nitrides.

For example, consider tantalum silicon nitride (TaSiN). With fairly high Si content, it works well as an embedded resistor in a ReRAM stack. However, the Si precursor tris (dimethylamino)silane (TDMAS) will only react with the N precursor $NH_3$ to form SiN at a process temperature greater than 500 C, while the Ta precursor (tert-butylimido)tris(diethylamido)tantalum(V) (TBTDETa) decomposes at temperatures above about 340 C. This disparity in tolerable temperature range poses serious obstacles to conventional co-deposition.

Therefore, a need exists for a way to form metal silicon nitrides with sufficiently high silicon-nitride content for embedded resistors without exceeding the process temperatures tolerated by the metal precursors; for example, by using a non-thermal type of energy to promote the silicon-nitride reaction. Plasma has been used, but may be inconvenient because of the specialized equipment needed.

SUMMARY

The following summary presents some concepts in a simplified form as an introduction to the detailed description that follows. It does not necessarily identify key or critical elements and is not intended to reflect a scope of invention.

Embodiments of methods for ALD and CVD of compounds with incompatible process windows, such as some metal silicon nitrides, form nanolaminates of component layers (e.g., metal nitride and silicon nitride) at a temperature within the reaction temperature range of the low-temperature precursor (e.g., ~200-400 C for many metal precursors of interest). The high-temperature precursor reaction (e.g., formation of silicon nitride), which would otherwise be thwarted by the substrate temperature being below the precursor's minimum reaction temperature, is assisted by a timed pulse of ultraviolet (UV) light. The energy imparted by the UV light takes the place of additional heat or exposure to activated plasma species in triggering the reaction.

In some example embodiments, a substrate temperature is below the minimum reaction temperature of a silicon precursor (e.g., 600-700 C for some precursors). A pulse of the Si precursor is followed by a first purge, then a pulse of a nitridant (e.g., $NH_3$ or $N_2H_4$), then a second purge. To avoid unintentionally breaking metal-nitride bonds, the UV light pulse begins after the beginning of the nitridant pulse and ends before the end of the second purge. The energy delivered by the UV pulse is also kept below a threshold that would form nitrogen-nitrogen bonds and potentially cause $N_2$ gas bubbles. SiN deposition rates may be, e.g., 0.05-0.1 nm/cycle, as compared to 0.001 nm/cycle without UV. Optionally, the pulse may be followed by a second UV pulse of a wavelength that breaks N—H bonds. This approach, though mostly discussed with reference to silicon nitride examples, may also be used for ternary or higher oxides or oxynitrides where one of the precursors has a reaction temperature too high for the other precursor to tolerate.

Embodiments of an ALD/CVD chamber equipped for UV irradiation include one or more UV sources positioned around a periphery of the chamber to obliquely irradiate the substrate. A controller triggers the UV pulses to synchronize with the post-silicon nitridant pulses. Optionally, a downward-facing surface of a showerhead may be made UV-reflective by polishing and/or coating to direct upward-traveling light down toward the substrate.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

Figure 1:
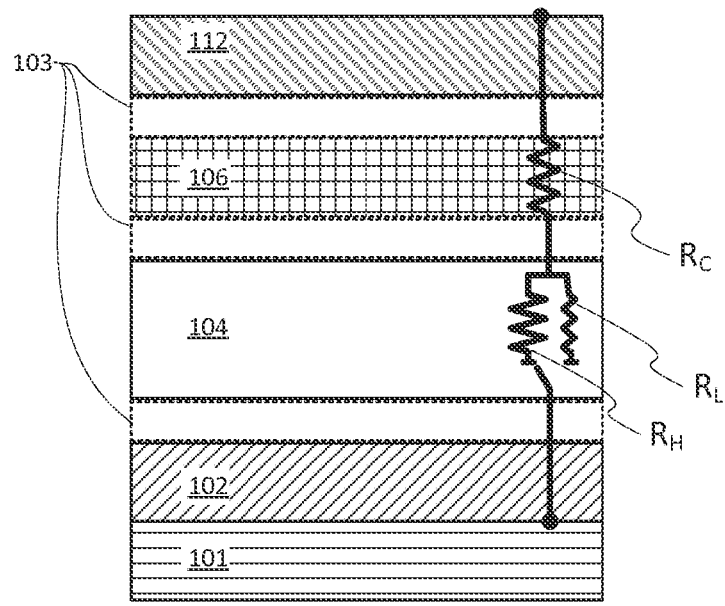
FIG. 1 is a simplified block diagram of a resistive-switching non-volatile memory (ReRAM) cell.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

As used herein, the following terms shall have the following meanings unless associated text or context indicates an exception:

"A," "an," and singular nouns: May include plural variations, e.g., "a layer" may mean "one or more layers."

"About" or "approximately": Within ±10% variation.

"Above" and "over": Either directly contacting or separated by intervening elements, may conform to an underlying 3D structure.

"Atomically smooth": Having rms surface roughness of ≲2.5 nm.

"Between" (range of values): Both boundary values and any value between the boundaries can be within the scope.

"Chemical vapor deposition": Depositing a film on a substrate from one or more vapor-phase chemical precursors that may be assisted to react by, e.g., heating the substrate.

"Constant resistance" (in a ReRAM embedded resistor layer): Resistance that remains approximately constant (e.g., ±25%) in response to either "read" or "write" signals.

"Dose": For a gas (e.g., a precursor) or plasma, the product of pressure (P) in torr and time (t) in seconds; For light, the product of intensity (I) in W/cm2, averaged over the irradiated area, and time (t) in seconds.

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"Horizontal": In a plane parallel to the surface of a substrate. "Above," "below," "bottom," "top," "side" (e.g. sidewall), "higher," "lower," "upper," "over," and "under" are relative to the horizontal plane.

"Inert gas": Includes noble gases (He, Ne, Ar, Kr, Xe) and, unless the text or context excludes it (e.g., by describing nitride formation as undesirable), nitrogen (N2).

"Metal nitride": Comprising nitrogen and one or more metals or semiconductors.

"Minimum reaction temperature": A temperature below which substantially no thermal reaction and/or decomposition occurs for a given precursor and/or reactant.

"Monolayer": A single layer of atoms or molecules covering a surface, with substantially all available bonding sites satisfied and substantially all individual members of the adsorbed species in direct physical contact with the underlying surface.

"On": Directly contacting, may conform to an underlying 3D structure.

"Or" in a list: Any, all, or any subset of list may be used.

"Reaction temperature range": A temperature range within which thermal reaction and/or decomposition occurs for a given precursor and/or reactant.

"Sub-monolayer" or "pre-wetting layer": Partial or incomplete monolayer; maximum thickness is one atom or molecule, but not all available bonding sites on the surface are covered, so that the average thickness is less than one atom or molecule.

"Substantially": Within up to +5% variation.

"Substrate": A wafer or any other workpiece on which formation or treatment of material layers is desired. Non-limiting examples include silicon, germanium, silica, sapphire, zinc oxide, SiC, AlN, GaN, Spinel, silicon on oxide, silicon carbide on oxide, glass, gallium nitride, indium nitride and aluminum nitride, glasses, combinations or alloys thereof, and other solid materials.

"Surface": Boundary between the ambient environment and a feature of the substrate.

"Ultraviolet" or "UV": Wavelength 10-400 nm, photon energy 3-124 eV.

"Variable resistance" (in a ReRAM resistive-switching layer): Resistance that is reversibly switched between at least two stable states by "write" signals, but remains approximately constant in response to "read" signals.

FIG. 1 is a simplified block diagram of a resistive-switching non-volatile memory (ReRAM) cell. This is a non-limiting example of an application that could make use of metal silicon nitrides with high Si content; other applications could also use them.

Substrate 101 may include additional layers and structures beneath the memory cell. Outer electrodes 102 and 112 are conductive layers that may form contacts with the word-lines and bit-lines that select a particular cell, within an array or group of other cells, to read or write. Variable-resistance (VR) layer (or stack) 104 reversibly, repeatably switches between at least two stable states (e.g., low-resistance state $R_L$ and high-resistance state $R_H$) in response to a "write" signal of an above-threshold energy transmitted through electrodes 102 or 112. For example, "write" signals may include a "set" signal that forms a conductive filament inside VR layer 104, producing the low-resistance state, and a "reset" signal that breaks, dissipates, or otherwise destroys the filament, returning the VR layer to the high-resistance state. In other types of memory, a write signal may change the phase, morphology, magnetic dipole, or some other electrical property of the VR layer or one or more of its interfaces. The "write" signal may be purely electrical, or may alternatively include a magnetic, thermal, or optical component. However, when a "read" signal is applied to sense the state of VR layer 104, its resistance does not change, generally because the "read" signal transfers only a sub-threshold energy to the layer.

Optionally, a constant-resistance layer (or stack) 106, also known as an embedded resistor (ER) may be included in the cell to prevent excessive current from flowing through variable-resistance layer 104 or some other sensitive structure in the cell. For example, in cells that change resistive state by forming and breaking conductive filaments, excessive current in a "set" signal could potentially create a filament so wide or dense as to be unbreakable by a normal "reset" signal. This would effectively lock the cell permanently in its low-resistance state, incapable of being overwritten. To prevent this, ER 106 acts like a non-variable resistor connected in series with the variable-resistance switch of VR layer 104, maintaining a constant resistance $R_C$ (e.g., within ±25% or less) when either "read" or "write" signals are applied to the cell.

In addition, any number of intervening layers 103 may be formed between electrodes 102 and 112. Examples of intervening layers (or stacks) include barrier layers to prevent inter-layer reactions or diffusion of metals or oxides; buffer layers; defect-access layers; doping layers; coupling layers; diodes or other current-steering components; intermediate electrodes; and others.

It is believed that increased nitrogen content may enable better performance of ER layers; for example, nitrogen increases the resistivity of the layer, allowing a thinner layer to be used to achieve a given resistance.

Figure 2A:
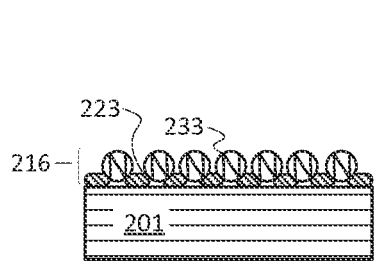
FIGS. 2A-D conceptually illustrate unassisted ALD of high-temperature and low-temperature precursors at low temperature.
Figure 2B:
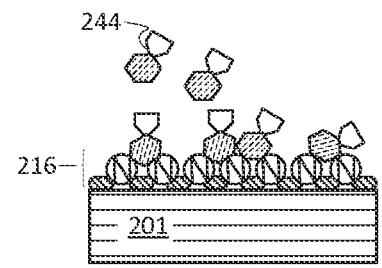

FIGS. 2A-D conceptually illustrate unassisted ALD of high-temperature and low-temperature precursors at low temperature. In FIG. 2A, a monolayer 216 has been formed on substrate 201 with the low-temperature precursor (e.g., metal nitride from a metal precursor). The metal 223 and the nitrogen 233 form a well-ordered full-coverage monolayer. In FIG. 2B, the high-temperature precursor 244 (e.g., a silicon precursor) is pulsed in the chamber. Because the substrate temperature is below the reaction temperature, precursor 244 does not react, but may physisorb onto the surface.

Figure 2C:
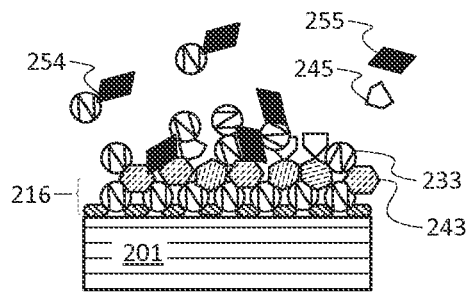
Figure 2D:
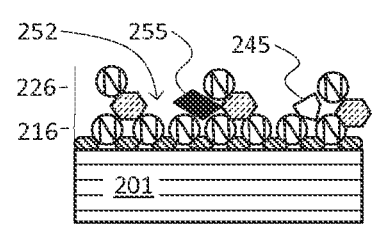

In FIG. 2C, a reactant 254 (e.g., a nitridant or oxidant) is pulsed in the chamber. Some fraction of it may react with the high-temperature precursor, for example due to collision kinetic energy, releasing ligands 245 and 255 and leaving behind deposited material 243 (e.g., Si) bonded to nitrogen 233. In FIG. 2D, most of the loosely adsorbed material has been carried away, for example by a purge. The high-temperature nitride layer 226 is a sub-monolayer with coverage gaps 252, and may also have trapped ligands 245, 255. The average thickness may range from sub-monolayers to several monolayers (accounting for molecules, trapped ligands, and gaps). Layers 226 formed below the reaction temperature of one of the precursors often exhibit poor adhesion and compromised performance (e.g., excessive resistivity in a conductive layer, or leakage in a dielectric layer).

Figure 3A:
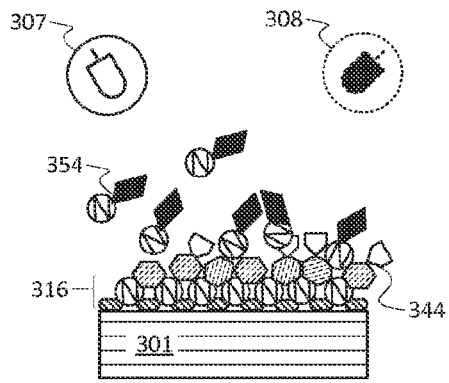
FIGS. 3A-D conceptually illustrate UV-assisted deposition below the reaction temperature.

FIGS. 3A-D conceptually illustrate UV-assisted deposition below the reaction temperature. In FIG. 3A, first UV light source 307 and optional second UV light source 308 are turned off or blocked (e.g., shuttered) until after the pulse of reactant (e.g., nitridant or oxidant) 354 has begun to adsorb on the surface of substrate 301. This is to ensure that UV light from sources 307 and 308 does not disrupt bonds on metal nitride monolayer 316.

Figure 3B:
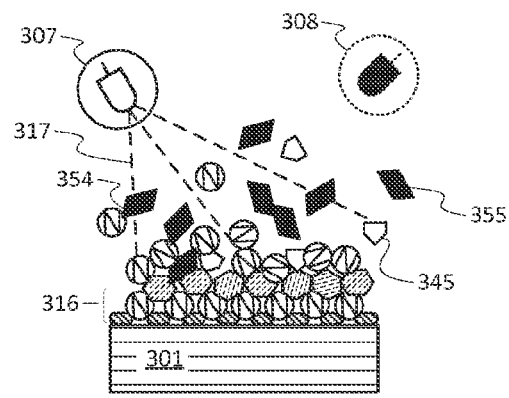

In FIG. 3B, after some reactant has been deposited and is thus in proximity to high-temperature (e.g., silicon) precursor 344, first UV light source 307 is turned on or unblocked to irradiate the substrate with a first spectrum of UV light 317. The spectrum of first UV light 317 may be broadband to break a wide variety of bonds, or specific wavelengths may be selected to detach the particular ligands 345, 355 from precursor 344 and nitridant 354. The energy imparted to the precursor and nitridant molecules promotes the nitride reaction that would otherwise require more heat. To avoid prematurely dissociating the precursor for the next layer, first UV light source is turned off or blocked again before the next precursor pulsed begins.

Figure 3C:
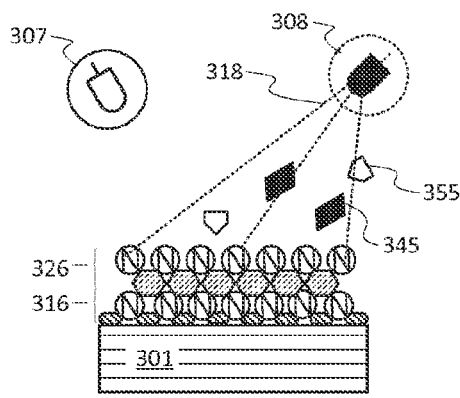

FIG. 3C shows an optional step where a second UV light source 308 is temporarily turned on (the first UV light source 307 may be turned on or off during this step). A second spectrum of UV light 318 from second UV light source 308 is different from first spectrum of light 317. For example, second spectrum of light 318 may have a narrow bandwidth around a wavelength selected to break a particular type of bond, such as an N—H bond. If some ligands 345, 355 remain trapped after the reaction, this second UV irradiation may force their release.

Figure 3D:
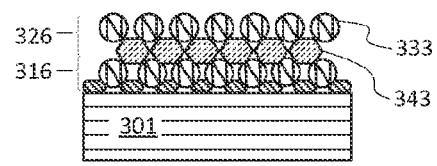

FIG. 3D shows the monolayer 326 formed from the high-temperature precursor with UV assistance. Even though the deposition temperature was below the high-temperature precursor's reaction temperature, monolayer 326 is well-ordered with good coverage. For example, the deposition rate of SiN with UV assistance may be 0.05-0.1 nm/cycle.

The UV light sources may be vapor lamps, arc lamps, UV LEDs, lasers, or any other controllable source producing suitable wavelengths and intensities.

Figure 4:
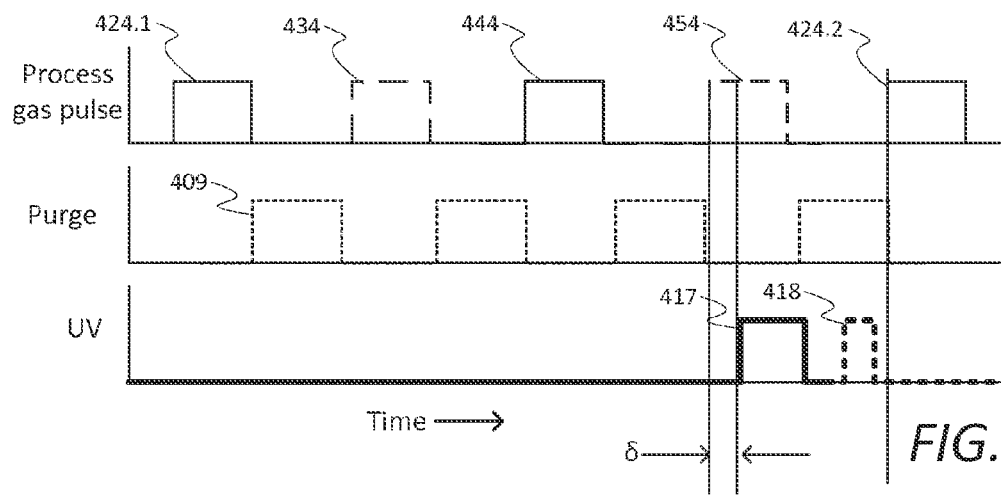
FIG. 4 is a sample timing diagram of UV-assisted deposition.

FIG. 4 is a sample timing diagram of UV-assisted deposition. The pulses are illustrated as square waves for simplicity, but alternatively they may have any suitable waveform such as triangular or sawtooth. The top track represents the process gas pulses: low-temperature (e.g., metal) precursor pulse 424.1, first reactant pulse 434, high-temperature (e.g., silicon) precursor pulse 444, second reactant pulse 454, and the next low-temperature precursor pulse 424.2 (which could alternatively be replaced with another high-temperature precursor pulse, depending on the desired nanolaminate profile). The middle track represents the purges 409 between the pulses (e.g., a noble gas such as argon). The bottom track represents the pulses of UV radiation of first spectrum of light 417 and optional second spectrum of light 418. UV radiation pulses 417 and, if used, 418 come after the leading edge of second reactant pulse 454 and before the leading edge of the next precursor pulse 424.2. There may be a calculated delay δ between the leading edge of second reactant pulse 454 and the leading edge of UV radiation pulse 417, to allow a threshold amount of reactant 454 to accumulate on the substrate surface before triggering the reaction. The gas pulses, purges, and UV pulses may be as short as 1 second or may be minutes long, depending on the embodiment.

Figure 5A:
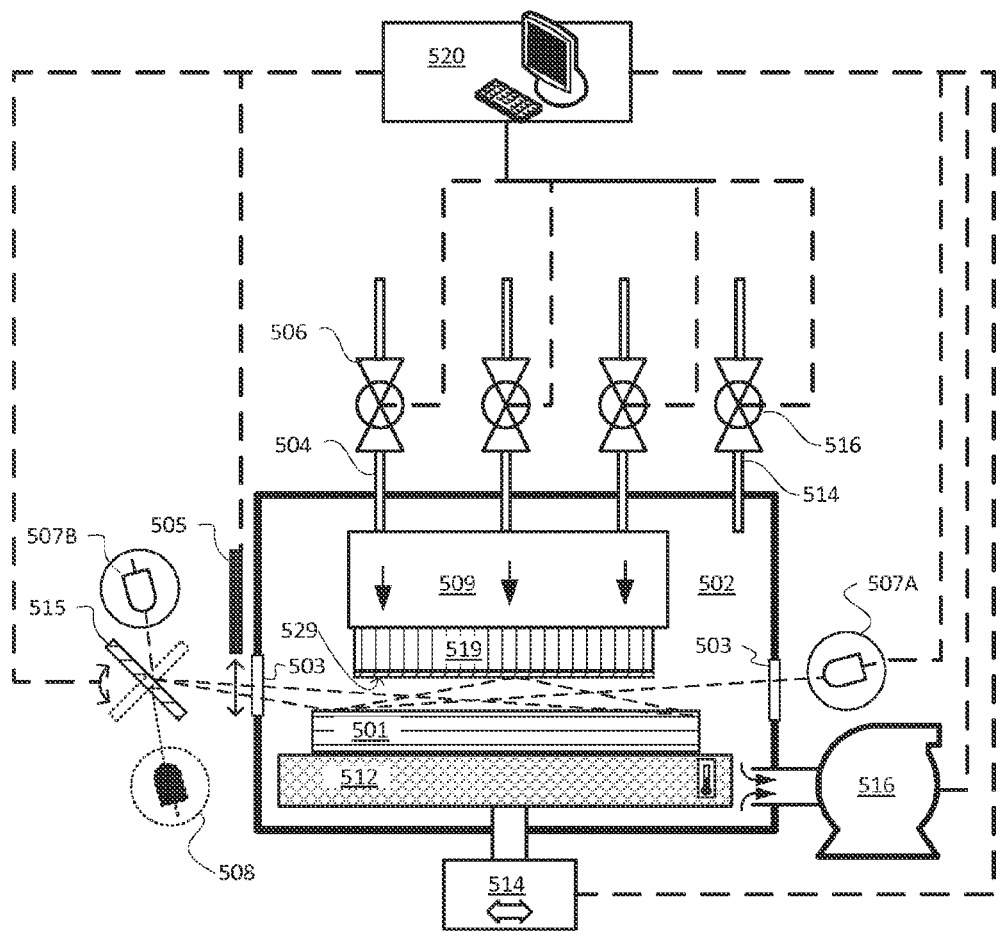
FIGS. 5A and 5B are a block diagrams of an ALD or CVD chamber equipped for UV-assisted deposition.
Figure 5B:
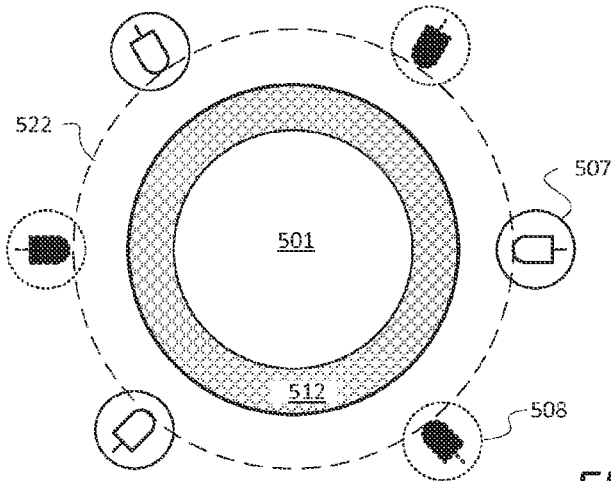

FIGS. 5A and 5B are a block diagrams of an ALD or CVD chamber equipped for UV-assisted deposition. For clarity, some components that may be included with some ALD or CVD chambers, such as a substrate-loading port, substrate lift pins, and electrical feedthroughs, are not shown. FIG. 5A is a schematic cut-away side view. Environmentally-controlled process chamber 502 contains substrate holder 512 to hold substrate 501 for processing. Substrate holder 512 may be made from a thermally conducting metal (e.g., tungsten, molybdenum, aluminum, nickel) or other like materials (e.g., a conductive ceramic) and may be temperature-controlled. Drive 514 may move substrate holder 512 (e.g., translate or rotate in any direction) during loading, unloading, process set-up, or sometimes during processing.

Process chamber 502 is supplied with process gases by gas delivery lines 504 (although three are illustrated, any number of delivery lines may be used). A valve and/or mass flow controller 506 may be connected to one or more of delivery lines 504 to control the delivery rates of process gases into process chamber 502. In some embodiments, gases are routed from delivery lines 504 into process chamber 502 through delivery port 509. For example, a first one of the delivery lines 504 may deliver a precursor through delivery port 509; a second one of the delivery lines 504 may deliver a reactant through delivery port 509; and a third one of the delivery lines 504 may deliver a purge gas (e.g., a noble gas) through delivery port 509. Delivery port 509 may be configured to premix the process gases (e.g., precursors and diluents), shape the distribution of the process gases over the surface of substrate 501, or both. Delivery port 509, sometimes called a "showerhead," may include a diffusion plate 519 that distributes the process gases through multiple holes. Vacuum pump 516 exhausts reaction products and unreacted gases from, and maintains the desired ambient pressure in, process chamber 502.

The UV light sources need to irradiate the top surface of substrate 501, which is often very close (~25 mm) to the bottom of diffusion plate 519. If a light source is vacuum-compatible it may be mounted in process chamber 502. Many light sources are not vacuum-compatible and are preferably mounted outside the chamber, aiming their light through a sealed window 503. Preferably the UV light source(s) and associated assemblies are positioned outside the space between the diffusion plate and the substrate, so as not to interfere with gas distribution from the diffusion plate to the substrate. Preferably window 503 is a UV-transmissive material such as UV-grade fused silica. Optionally, window 503 may have a UV anti-reflective coating.

Some UV light sources, such as UV-LEDs, can rapidly be turned on and off and cycled many times without impacting their lifetime or performance. Such sources may be controlled simply by controlling the power supply, as shown for UV light source 507A. Other sources, such as arc or vapor lamps and some lasers, may need warm-up time or may be harmed by excessive power cycling. Those sources may be left powered on while the chamber is operating, and their light blocked and unblocked by a movable shutter 505 or similar mechanical means, such as rotating the light source or a mirror reflecting the light to aim at a beam-dump rather than through window 503 at substrate 501.

In some embodiments, a UV-reflective coating 529 may be applied to the bottom of diffusion plate 519. In many diffusion plates, the gas outlet holes only account for 5-10% of the area, leaving 90-95% of the area to reflect light. Since the light will reflect at near-grazing incidence (very shallow angle), the reflection can be fairly efficient. Since only irradiation is desired, and not imaging or focusing to a small spot, the diffusion plate's lack of optical flatness is not a serious drawback.

A pair of UV sources 507B and 508 are mounted to aim their light through window 503 or not, depending on the position of tiltable mirror 515. At one angle, mirror 515 aims light from UV source 507B through window 503. At another angle, mirror 515 aims light from UV source 508 through window 503. At other angles, it aims neither light through window 503. This is one way to quickly change the illumination from one spectrum to another, if UV sources 507b and 508 have different spectra. For example, UV source 507b may have a broad spectrum to assist a variety of possible reactions, while UV source 508 may have a narrower spectrum selected to break certain targeted bonds between materials adsorbed on the substrate, such as N—H bonds.

Controller 520 may be connected to control various components of the apparatus to produce a desired set of process conditions. Controller 520 may include one or more memory devices and one or more processors with a central processing unit (CPU) or computer, analog and/or digital input/output connections, stepper motor controller boards, and the like. In some embodiments, controller 520 executes system control software including sets of instructions for controlling timing, gas flows, chamber pressure, chamber temperature, substrate temperature, radio frequency (RF) power levels (if RF components are used, e.g., for process gas dissociation), and other parameters such as power to the UV sources, positions of shutters or moveable mirrors, and other variable settings such as source intensity or source angle. The power or the positions of shutters and movable mirrors may be controlled so that the substrate irradiation depends on the gases being delivered through diffusion plate 519. For example, the controller may cause the UV light source(s) to irradiate the substrate while reactants or purge gases are being delivered through the diffusion plate, but not while precursors are being delivered. Other computer programs and instruction stored on memory devices associated with controller 520 may be employed in some embodiments.

FIG. 5B is a schematic cut-away top view of an embodiment with multiple UV sources 507 and 508 positioned around a periphery 522 of chamber 502, aiming in at substrate 501 resting on substrate holder 512.

Figure 6:
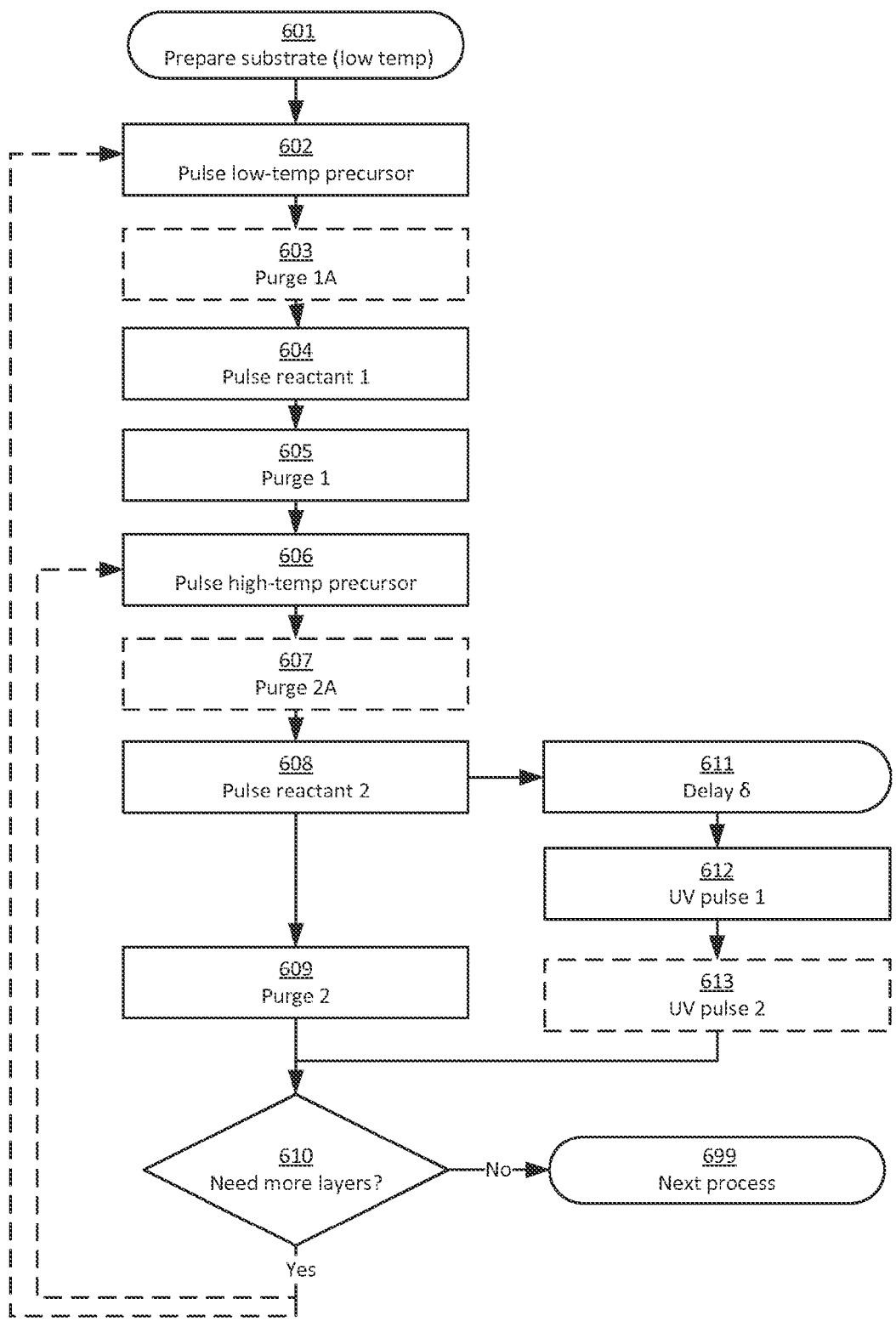
FIG. 6 is a process flowchart for UV-assisted ALD or CVD.

FIG. 6 is a process flowchart for UV-assisted ALD or CVD. Step 601 of preparing the substrate includes placing the substrate in a chamber at a temperature within the reaction range of the low-temperature precursor (e.g., 200-400 C, depending on the precursor). Step 602 of pulsing the low temperature precursor may continue for 2 seconds to 1 minute. For ALD "A-B" cycles, a first mid-cycle purge 603 may follow; for CVD, first mid-cycle purge 603 may be omitted. Step 604 of pulsing the first reactant to react with the low-temperature precursor may continue for 2 seconds to 1 minute. This reaction forms a layer based on the material deposited by the first precursor (e.g., an oxide, nitride or oxynitride of a metal). For both ALD and CVD, a first post-cycle purge 605 follows.

Step 606 of pulsing the high-temperature precursor (i.e., a precursor with a higher reaction temperature than the present substrate temperature) may continue for 2 seconds to 1 minute. For ALD "A-B" cycles, a second mid-cycle purge 607 may follow; for CVD, second mid-cycle purge 607 may be omitted. Step 608 of pulsing the second reactant may continue for 2 seconds to 1 minute, and is followed by second post-cycle purge 609 for both ALD and CVD.

Meanwhile, the UV illumination system enters a delay step 611 as second reactant pulse 608 begins. After delay time δ elapses, in step 612 a first UV source illuminates the substrate with a first pulse of light for a time span of seconds or minutes. This first pulse assists a reaction between the high-temperature precursor and the second reactant, forming a layer based on the material deposited by the second precursor (e.g., an oxide, nitride or oxynitride of silicon) without requiring excess heat. In some embodiments, no plasma activated species are injected into the chamber to further assist the reaction. In optional step 613, a second UV source illuminates the substrate with a second pulse of light. The second UV source may have a spectrum selected to break certain targeted bonds, e.g., to release any remaining trapped ligands. The last of the UV pulses ends when second post-cycle purge 609 ends, or earlier.

Any number of layers may be formed to reach a desired thickness; for example, 2-10 nm is a common thickness for ReRAM ER layers. At decision point 610, if the desired thickness has been reached, no more layers are needed and next process 699 may commence. If more layers are needed, either another unassisted layer may be formed with the low-temperature precursor or another UV-assisted layer may be formed with the high-temperature precursor.

For example, the low-temperature precursor may be a precursor for hafnium (Hf), lutetium (Lu), molybdenum (Mo), tantalum (Ta), titanium (Ti), tungsten (W), or zirconium (Zr). The first reactant may be an oxidant, a nitridant, or a combination. The second reactant may be a silicon precursor, e.g., a silane, disilane, trisilane, tetrasilane, isopentasilane, or other higher order silanes. The second reactant may be an oxidant, a nitridant, or a combination; in particular, the second reactant may be $NH_3$ or $N_2H_4$. The substrate temperature may be less than 400 C, less than 300 C, or even less than 200 C. The deposited layers may be 0.01 nm-0.1 nm thick for ALD or up to 3 nm thick for CVD. The UV light pulse(s) may begin during the second reactant pulse or during the subsequent purge.

Precursors for the metals may include, without limitation:

Hf: (diethylamido)hafnium (TDEAHf), tetrakis(dimethylamido)hafnium (TDMAHf), tetrakis(ethylmethylamido) hafnium (TEMAHf) or hafnium chloride ($HfCl_4$).

Lu: lutetium(III) acetate hydrate ($C_6H_9LuO_6.xH_2O$), lutetium(III) acetate hydrate ($C_{15}H_{21}LuO_6.xH_2O$).

Mo: (bicyclo[2.2.1]hepta-2,5-diene)tetracarbonylmolybdenum(0) ($C_{11}H_8MoO_4$), bis(cyclopentadienyl)molybdenum(IV) dichloride ($C_{10}H_{10}Cl_2Mo$), cyclopentadienylmolybdenum(II) tricarbonyl, dimer ($C_{16}H_{10}Mo_2O_6$), molybdenumhexacarbonyl ($Mo(CO)_6$), propylcyclopentadienyl)molybdenum(I) tricarbonyl dimer ($C_{22}H_{22}Mo_2O_6$).

Ta: pentakis(dimethylamino)tantalum(V) ($Ta(N(CH_3)_2)_5$), tantalum(V) ethoxide ($Ta(OC_2H_5)_5$), tris(diethylamido)(tert-butylimido)tantalum(V) (($CH_3)_3CNTa(N(C_2H_5)_2)_3$), tris(ethylmethylamido)(tert-butylimido)tantalum(V) ($C_{13}H_{33}N_4Ta$).

Ti: titanium(IV) chloride, titanium(IV) ethoxide, titanium (IV) i-propoxide, titanium(IV) n-butoxide, titanium(IV) t-butoxide, tetrakis(diethylamino)titanium(IV), cyclopentadienyl(cycloheptatrienyl)titanium(II), (trimethyl) pentamethylcyclopentadienyltitanium(IV), tris(2,2,6,6-tetramethyl-3,5-heptanedionato)titanium(III).

W: bis(butylcyclopentadienyl)tungsten(IV) diiodide ($C_{18}H_{26}I_2W$), bis(tert-butylimino)bis(tert-butylamino)tungsten (($C_4H_9NH)_2W(C_4H_9N)_2$), bis(tert-butylimino)bis(dimethylamino)tungsten(VI) $(((CH_3)_3CN)_2W(N(CH_3)_2)_2)$, bis (cyclopentadienyl)tungsten(IV) dichloride $(C_{10}H_{10}Cl_2W)$, bis(cyclopentadienyl)tungsten(IV) dihydride $(C_{10}H_{12}W)$, bis (isopropylcyclopentadienyl)tungsten(IV) dihydride $((C_5H_4CH(CH_3)_2)_2WH_2)$, cyclopentadienyltungsten(II) tricarbonyl hydride $(CSH_6O_3W)$, tetracarbonyl(1,5-cyclooctadiene)tungsten(0) $(C_{12}H_{12}O_4W)$, triamminetungsten(IV) tricarbonyl $((NH_3)_3W(CO)_3)$.

Zr: bis(cyclopentadienyl)zirconium(IV) dihydride $(C_{10}H_{12}Zr)$, bis(methyl-$\eta^5$-cyclopentadienyl)methoxymethylzirconium $(Zr(CH_3CsH_4)_2CH_3OCH_3)$, dimethylbis(pentamethylcyclopentadienyl)zirconium(IV) $(C_{22}H_{36}Zr)$, tetrakis(diethylamido)zirconium(IV) $([(C_2H_5)_2N]_4Zr)$, tetrakis (ethylmethylamido)zirconium(IV) $(Zr(NCH_3C_2H_5)_4)$, zirconium(IV) diisopropoxidebis(2,2,6,6-tetramethyl-3,5-heptanedionate) $(Zr(OCC(CH_3)_3CHCOC(CH_3)_3)_2(OC_3H_7)_2)$, zirconium tetrakis(2,2,6,6-tetramethyl-3,5-heptanedionate) $(Zr(OCC(CH_3)_3CHCOC(CH_3)_3)_4)$.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method, comprising:
   providing a substrate in a chamber;
   injecting a pulse of a first precursor into the chamber, wherein a temperature of the substrate is within a reaction temperature range of the first precursor;
   injecting a pulse of a first reactant into the chamber, wherein the first reactant reacts with the first precursor to form a first layer;
   performing a first purge of the chamber;
   injecting a pulse of a second precursor into the chamber, wherein the temperature of the substrate is below a minimum reaction temperature of the second precursor;
   injecting a pulse of a second reactant into the chamber;
   performing a second purge of the chamber; and
   after the beginning of the injecting a pulse of a second reactant irradiating the substrate with a first ultraviolet source; and
   wherein the irradiating terminates before terminating the second purge of the chamber.

2. The method of claim 1, wherein the second reactant reacts with the second precursor to form a second layer while the substrate is being irradiated with the first ultraviolet spectrum.

3. The method of claim 1, wherein the first precursor comprises a metal precursor.

4. The method of claim 1, wherein the first precursor comprises a precursor for hafnium (Hf), lutetium (Lu), molybdenum (Mo), tantalum (Ta), titanium (Ti), tungsten (W), or zirconium (Zr).

5. The method of claim 1, wherein the first reactant or the second reactant comprises an oxidant, a nitridant, or an oxidant-nitridant mixture.

6. The method of claim 1, wherein the second reactant comprises $NH_3$ or $N_2H_4$.

7. The method of claim 1, wherein the substrate temperature is less than about 300 C.

8. The method of claim 1, wherein the substrate temperature is less than about 200 C.

9. The method of claim 1, wherein the minimum reaction temperature of the second precursor is greater than 500 C.

10. The method of claim 1, wherein the minimum reaction temperature of the second precursor is greater than 600 C.

11. The method of claim 1, wherein the second precursor comprises silicon.

12. The method of claim 1, wherein a deposition rate of the reaction between the second precursor and the second reactant is between 0.05 nm/cycle and 2.0 nm/cycle.

13. The method of claim 1, further comprising irradiating the substrate with a second ultraviolet source, wherein the second ultraviolet spectrum differs from the first ultraviolet spectrum.

* * * * *